(12) United States Patent
Park et al.

(10) Patent No.: US 12,238,984 B2
(45) Date of Patent: Feb. 25, 2025

(54) DISPLAY DEVICE AND METHOD OF MANUFACTURING DISPLAY DEVICE

(71) Applicant: Samsung Display Co., Ltd., Yongin-Si (KR)

(72) Inventors: Gwui-Hyun Park, Hwaseong-si (KR); Koichi Sugitani, Suwon-si (KR); Hye In Kim, Hwaseong-si (KR); Chulwon Park, Hwaseong-si (KR); Pil Soon Hong, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 917 days.

(21) Appl. No.: 17/356,937

(22) Filed: Jun. 24, 2021

(65) Prior Publication Data

US 2022/0115489 A1   Apr. 14, 2022

(30) Foreign Application Priority Data

Oct. 13, 2020   (KR) .................. 10-2020-0132211

(51) Int. Cl.
*H10K 59/131*   (2023.01)
*H10K 59/12*   (2023.01)

(52) U.S. Cl.
CPC ....... *H10K 59/131* (2023.02); *H10K 59/1201* (2023.02)

(58) Field of Classification Search
CPC ............. H10K 59/131; H10K 59/1213; H10K 59/121; H10K 59/123; H10K 2102/3026
See application file for complete search history.

(56) References Cited

U.S. PATENT DOCUMENTS 9,099,674 B2   8/2015   Ha et al.
2008/0024402 A1*  1/2008   Nishikawa ........... H10K 50/813
                                                                    345/82

* cited by examiner

*Primary Examiner* — Wasiul Haider
(74) *Attorney, Agent, or Firm* — CANTOR COLBURN LLP

(57) ABSTRACT

A display device includes a first light emitting element in a first display area, a first pixel circuit in a first non-display area spaced from the first display area and connected to the first light emitting element, an insulating layer covering the first pixel circuit, a metal wiring on the insulating layer, connected to the first pixel circuit, and extending from the first non-display area to a second non-display area between the first display area and the first non-display area, and a transparent wiring on the insulating layer, connecting the first light emitting element and the metal wiring, and extending from the first display area to a surface of the metal wiring, where a trench is defined in a surface of the insulating layer in the second non-display area, and the metal wiring is in the trench in the second non-display area.

20 Claims, 15 Drawing Sheets

DISPLAY DEVICE AND METHOD OF MANUFACTURING DISPLAY DEVICE

This application claims priority to Korean Patent Application No. 10-2020-0132211, filed on Oct. 13, 2020, and all the benefits accruing therefrom under 35 U.S.C. § 119, the content of which in its entirety is herein incorporated by reference.

BACKGROUND

1. Field

Embodiments relate to a display device. More particularly, embodiments relate to a display device including a narrow bezel and a method of manufacturing the display device.

2. Description of the Related Art

A display device may convert an electrical signal to display an image, thereby providing visual information to a user. The display device may include a transmissive area that transmits external light incident on the display device. Functional modules such as a camera module, a sensor module, etc., disposed on a rear surface of the display device may detect or recognize an object, a user, etc., located on a front surface of the display device through the transmissive area.

In order to increase the transmittance of the transmissive area, the display device may include a transparent wiring disposed in the transmissive area.

SUMMARY

Since a transparent wiring has a relatively small thickness compared to an opaque metal wiring, a disconnection defect may occur in the transparent wiring due to a step under the transparent wiring.

Embodiments provide a display device for preventing a disconnection defect of a transparent wiring.

Embodiments provide a method of manufacturing a display device for preventing a disconnection defect of a transparent wiring.

A display device in an embodiment includes a substrate including a first display area, a first non-display area spaced apart from the first display area, and a second non-display area disposed between the first display area and the first non-display area, a first light emitting element disposed on the substrate in the first display area, a first pixel circuit disposed on the substrate in the first non-display area and electrically connected to the first light emitting element, a first insulating layer disposed on the substrate, covering the first pixel circuit, and including a first surface facing the substrate, a metal wiring disposed on the first insulating layer, connected to the first pixel circuit, extending from the first non-display area to the second non-display area and including a first surface facing the first insulating layer, and a transparent wiring disposed on the first insulating layer, connecting the first light emitting element and the metal wiring, and extending from the first display area to a second surface of the metal wiring opposite to the first surface of the metal wiring. A trench is defined in a second surface of the first insulating layer opposite to the first surface of the first insulating layer in the second non-display area. The metal wiring is disposed in the trench in the second non-display area.

In an embodiment, a depth of the trench may be less than a thickness of the first insulating layer along a direction perpendicular to a main plane extension direction of the substrate.

In an embodiment, a depth of the trench may be substantially equal to a thickness of the first insulating layer along a direction perpendicular to a main plane extension direction of the substrate.

In an embodiment, a depth of the trench may be greater than a thickness of the first insulating layer along a direction perpendicular to a main plane extension direction of the substrate.

In an embodiment, a depth of the trench may be less than a thickness of the metal wiring along a direction perpendicular to a main plane extension direction of the substrate.

In an embodiment, a depth of the trench may be substantially equal to a thickness of the metal wiring along a direction perpendicular to a main plane extension direction of the substrate.

In an embodiment, a thickness of the transparent wiring may be less than a thickness of the metal wiring along a direction perpendicular to a main plane extension direction of the substrate.

In an embodiment, the first insulating layer may include an inorganic insulating material.

In an embodiment, the display device may further include a second insulating layer disposed between the substrate and the first insulating layer.

In an embodiment, the trench may be recessed from the second surface of the first insulating layer to at least a portion of the second insulating layer.

In an embodiment, the second insulating layer may include an inorganic insulating material.

In an embodiment, the first insulating layer may include an organic insulating material.

In an embodiment, the first light emitting element may include a pixel electrode, an emission layer disposed on the pixel electrode, and an opposite electrode disposed on the emission layer. The transparent wiring may be connected to the pixel electrode.

In an embodiment, the transparent wiring may include at least one of indium tin oxide ("ITO"), indium zinc oxide ("IZO"), indium gallium oxide ("IGO"), tin oxide ($SnO_2$), and zinc oxide (ZnO).

In an embodiment, the substrate may further include a second display area surrounding at least a portion of the first display area. The display device may further include a second light emitting element disposed on the substrate in the second display area and a second pixel circuit overlapping the second light emitting element and electrically connected to the second light emitting element.

In an embodiment, a transmittance of the first display area may be greater than a transmittance of the second display area.

A method of manufacturing a display device in an embodiment includes forming a first pixel circuit on a substrate in a first non-display area spaced apart from a first display area, forming a first insulating layer covering the first pixel circuit on the substrate and including a first surface facing the substrate, defining a trench in a second surface of the first insulating layer opposite to the first surface of the first insulating layer in a second non-display area disposed between the first display area and the first non-display area, forming a metal wiring connected to the first pixel circuit, extending from the first non-display area into the trench in the second non-display area on the first insulating layer, and including a first surface facing the first insulating layer, forming a transparent wiring extending from the first display area to a second surface of the metal wiring opposite to the first surface of the metal wiring on the first insulating layer, and forming a first light emitting element connected to the transparent wiring on the first insulating layer in the first display area.

In an embodiment, the trench may be defined using a halftone mask or a slit mask.

In an embodiment, the first insulating layer may include an inorganic insulating material.

In an embodiment, the first insulating layer may include an organic insulating material.

In the display device in the embodiments, the trench recessed downward from the upper surface of the first insulating layer may be defined in the first insulating layer in the second non-display area, and the metal wiring may be disposed in the trench in the second non-display area, so that a step due to the metal wiring may be reduced. Accordingly, a disconnection defect of the transparent wiring, which connects the first light emitting element and the metal wiring and extends from the first display area to the upper surface of the metal wiring, due to the step of the metal wiring may be prevented.

In the method of manufacturing the display device in the embodiments, the trench recessed downward from the upper surface of the first insulating layer may be defined in the second non-display area, and the metal wiring connected to the first pixel circuit and extending from the first non-display area into the trench in the second non-display area may be disposed on the first insulating layer, so that a step due to the metal wiring may be reduced. Accordingly, a disconnection defect of the transparent wiring may be prevented. Further, the trench may be defined using the halftone mask or the slit mask, so that an additional process for forming the trench may not be desired.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
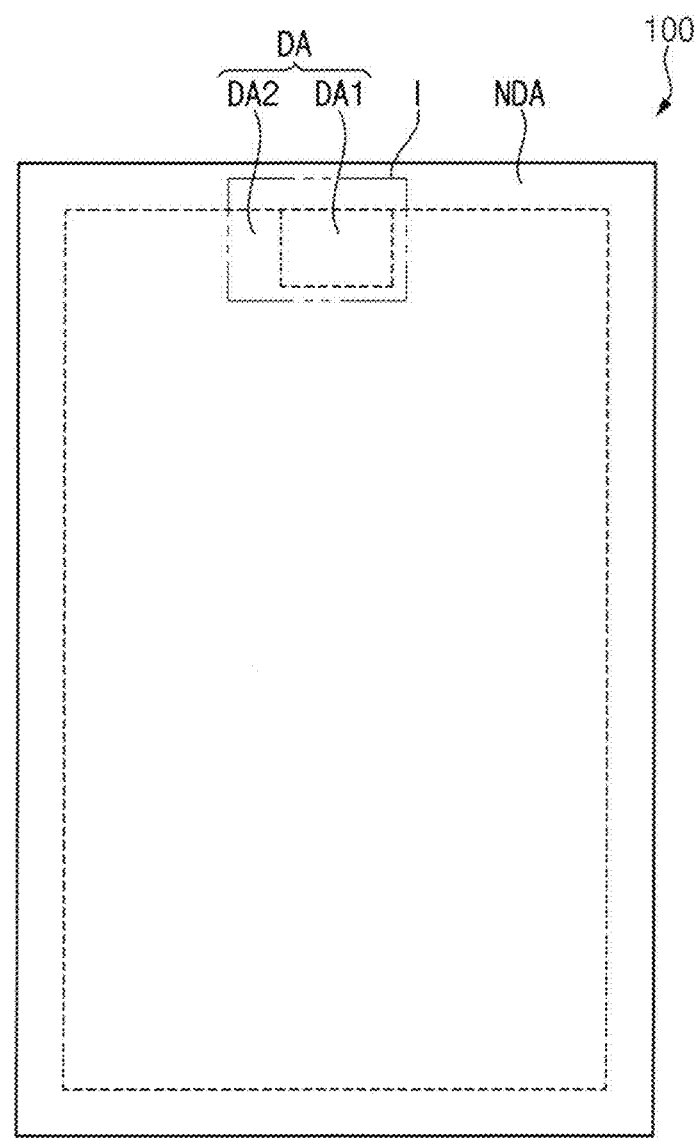
FIG. 1 is a plan view illustrating an embodiment of a display device.

Hereinafter, display devices and methods of manufacturing display devices in embodiments will be explained in detail with reference to the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a plan view illustrating an embodiment of a display device.

Referring to FIG. 1, the display device 100 may include a display area DA and a non-display area NDA. The non-display area NDA may surround at least a portion of the display area DA. The display area DA may include a first display area DA1 and a second display area DA2. The second display area DA2 may surround at least a portion of the first display area DA1.

Figure 2:
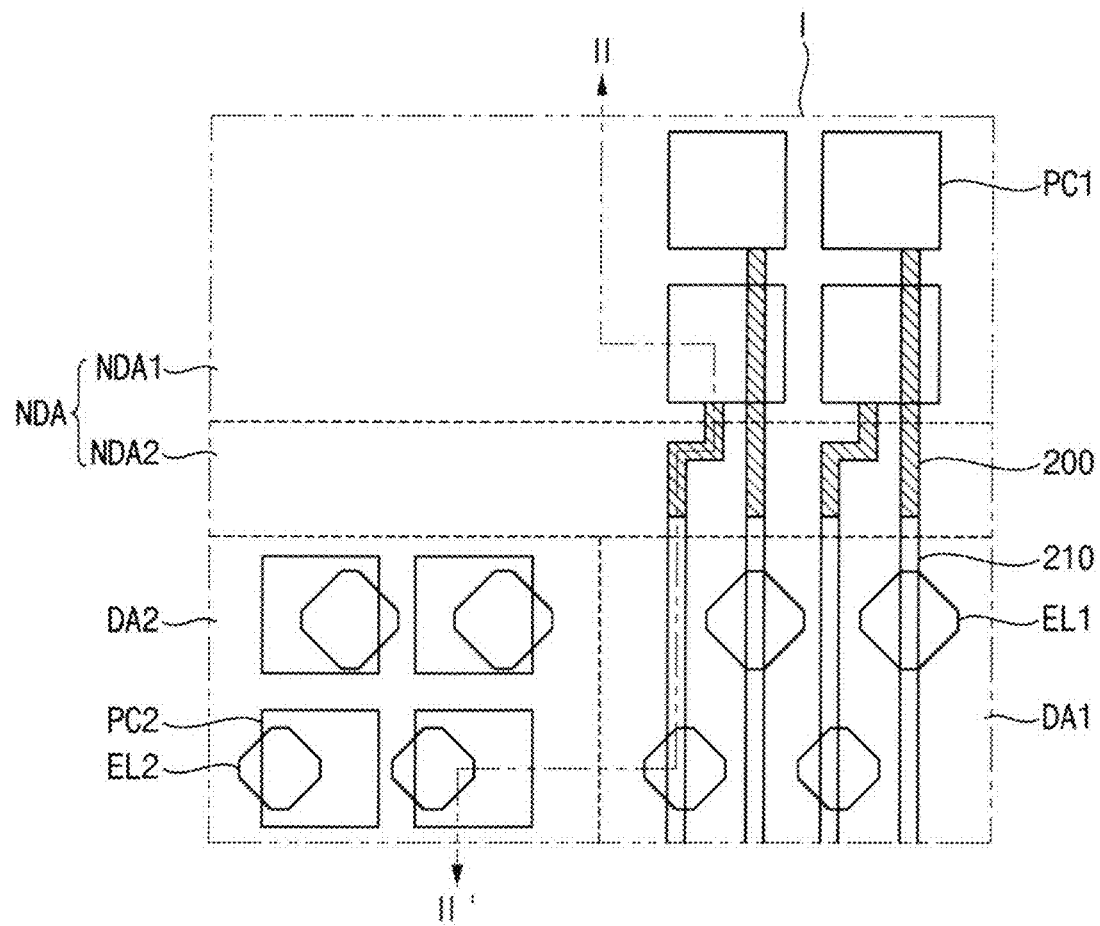
FIG. 2 is an enlarged plan view illustrating an area I in FIG. 1.

FIG. 2 is an enlarged plan view illustrating an area I in FIG. 1.

Referring to FIGS. 1 and 2, the non-display area NDA may include a first non-display area NDA1 and a second non-display area NDA2. The first non-display area NDA1 may be spaced apart from the first display area DA1, and the second non-display area NDA2 may be disposed between the first display area DA1 and the first non-display area NDA1.

First light emitting elements EL1 may be disposed in the first display area DA1. In an embodiment, each of the first light emitting elements EL1 may emit at least one of red light, green light, and blue light.

First pixel circuits PC1 may be disposed in the first non-display area NDA1. The first light emitting elements EL1 may be connected to the first pixel circuits PC1 by metal wirings 200 and transparent wirings 210. The first pixel circuits PC1 may provide driving currents to the first light emitting elements EL1.

The metal wirings 200 may be respectively connected to the first pixel circuits PC1. The metal wirings 200 may extend from the first pixel circuits PC1 disposed in the first non-display area NDA1 to the second non-display area NDA2.

The transparent wirings 210 may be respectively connected to the first light emitting elements EL1. The transparent wirings 210 may extend from the first light emitting elements EL1 disposed in the first display area DA1 to the second non-display area NDA2. The transparent wirings 210 may be respectively connected to the metal wirings 200 in the second non-display area NDA2.

Second light emitting elements EL2 and second pixel circuits PC2 may be disposed in the second display area DA2. In an embodiment, each of the second light emitting elements EL2 may emit at least one of red light, green light, and blue light. The second pixel circuits PC2 may respectively overlap the second light emitting elements EL2, and may be respectively connected to the second light emitting elements EL2. The second pixel circuits PC2 may provide driving currents to the second light emitting elements EL2.

In an embodiment, a transmittance of the first display area DA1 may be greater than a transmittance of the second display area DA2. In an embodiment, the first display area DA1 may transmit external light, and the second display area DA2 may not transmit the external light, for example. Accordingly, the first display area DA1 may be a transmissive area, and the second display area DA2 may be a non-transmissive area.

Figure 3:
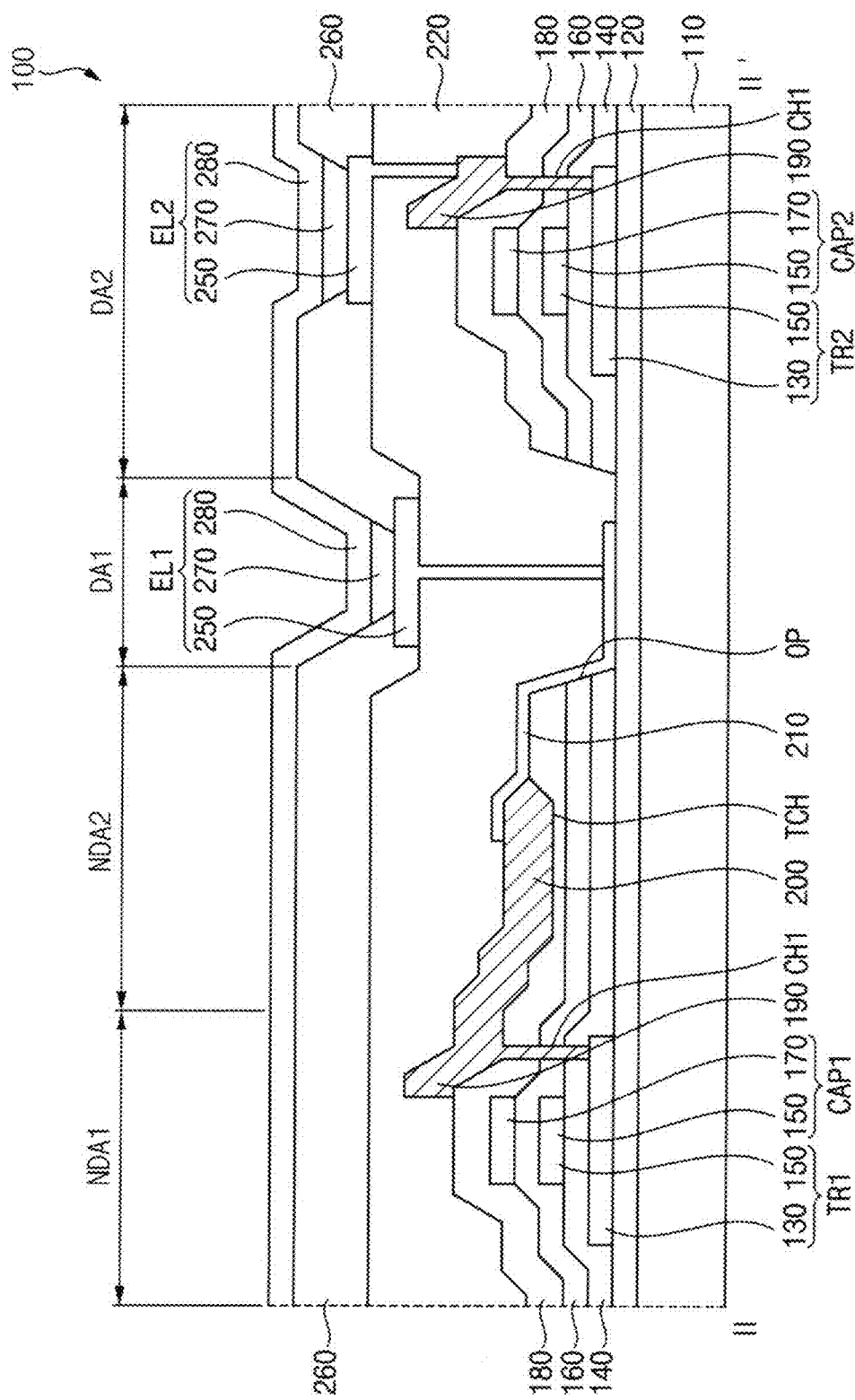
FIG. 3 is a cross-sectional view illustrating the display device taken along line II-II' in FIG. 2.

FIG. 3 is a cross-sectional view illustrating the display device 100 taken along line II-II' in FIG. 2.

Referring to FIGS. 2 and 3, the display device 100 may include a substrate 110, a buffer layer 120, an active pattern 130, a first gate insulating layer 140, a first gate electrode 150, a second gate insulating layer 160, a second gate electrode 170, an inter-insulating layer 180, a first source/drain electrode 190, the metal wiring 200, the transparent wiring 210, a first via-insulating layer 220, a pixel electrode 250, a pixel defining layer 260, an emission layer 270, and an opposite electrode 280.

The substrate 110 may be a transparent insulating substrate. In an embodiment, the substrate 110 may include glass, quartz, plastic, or the like, for example.

The buffer layer 120 may be disposed on the substrate 110. In an embodiment, the buffer layer 120 may include an inorganic insulating material such as silicon nitride, silicon oxide, silicon oxynitride, or the like.

The active pattern 130 may be disposed on the buffer layer 120. The active pattern 130 may be disposed in the first non-display area NDA1 and the second display area DA2. In an embodiment, the active pattern 130 may include amorphous silicon, polycrystalline silicon, or the like. In another embodiment, the active pattern 130 may include an oxide semiconductor or the like.

The first gate insulating layer 140 may be disposed on the active pattern 130. The first gate insulating layer 140 may cover the active pattern 130 on the buffer layer 120. In an embodiment, the first gate insulating layer 140 may include an inorganic insulating material such as silicon nitride, silicon oxide, silicon oxynitride, or the like.

The first gate electrode 150 may be disposed on the first gate insulating layer 140. The first gate electrode 150 may be disposed in the first non-display area NDA1 and the second display area DA2. The first gate electrode 150 may overlap the active pattern 130. In an embodiment, the first gate electrode 150 may include a metal such as copper (Cu), molybdenum (Mo), aluminum (Al), titanium (Ti), or the like.

The active pattern 130 and the first gate electrode 150 may form transistors. In an embodiment, the active pattern 130 and the first gate electrode 150 may form a first transistor TR1 in the first non-display area NDA1, and may form a second transistor TR2 in the second display area DA2.

The second gate insulating layer 160 may be disposed on the first gate electrode 150. The second gate insulating layer 160 may cover the first gate electrode 150 on the first gate insulating layer 140. In an embodiment, the second gate insulating layer 160 may include an inorganic insulating material such as silicon nitride, silicon oxide, silicon oxynitride, or the like.

The second gate electrode 170 may be disposed on the second gate insulating layer 160. The second gate electrode 170 may be disposed in the first non-display area NDA1 and the second display area DA2. The second gate electrode 170 may overlap the first gate electrode 150. In an embodiment, the second gate electrode 170 may include a metal such as copper (Cu), molybdenum (Mo), aluminum (Al), titanium (Ti), or the like.

The first gate electrode 150 and the second gate electrode 170 may form capacitors. In an embodiment, the first gate electrode 150 and the second gate electrode 170 may form a first capacitor CAP1 in the first non-display area NDA1, and may form a second capacitor CAP2 in the second display area DA2.

The first transistor TR1 and the first capacitor CAP1 disposed in the first non-display area NDA1 may form the first pixel circuit PC1. In other words, the first pixel circuit PC1 may include the first transistor TR1 and the first capacitor CAP1. The second transistor TR2 and the second capacitor CAP2 disposed in the second display area DA2 may form the second pixel circuit PC2. In other words, the second pixel circuit PC2 may include the second transistor TR2 and the second capacitor CAP2.

The inter-insulating layer 180 may be disposed on the second gate electrode 170. The inter-insulating layer 180 may cover the second gate electrode 170 on the second gate insulating layer 160. In an embodiment, the inter-insulating layer 180 may include an inorganic insulating material such as silicon nitride, silicon oxide, silicon oxynitride, or the like.

A first contact hole CH1 may be defined in the first gate insulating layer 140, the second gate insulating layer 160, and the inter-insulating layer 180 in each of the first non-display area NDA1 and the second display area DA2. The first contact hole CH1 may expose the active pattern 130.

An opening OP may be defined in the first gate insulating layer 140, the second gate insulating layer 160, and the inter-insulating layer 180 in the first display area DA1. As the opening OP is defined, the first gate insulating layer 140, the second gate insulating layer 160, and the inter-insulating layer 180 may not be disposed in the first display area DA1. As the opening OP is defined in the first display area DA1, the transmittance of the first display area DA1 may be greater than the transmittance of the second display area DA2.

The first source/drain electrode 190 may be disposed on the inter-insulating layer 180. The first source/drain electrode 190 may be disposed in the first non-display area NDA1 and the second display area DA2. The first source/drain electrode 190 may be connected to the active pattern 130 through the first contact hole CH1. In an embodiment, the first source/drain electrode 190 may include a metal such as copper (Cu), molybdenum (Mo), aluminum (Al), titanium (Ti), or the like.

The metal wiring 200 may be disposed on the inter-insulating layer 180. The metal wiring 200 may be connected to the first pixel circuit PC1, and may extend from the first non-display area NDA1 to the second non-display area NDA2. The metal wiring 200 may be connected to the first source/drain electrode 190 disposed in the first non-display area NDA1. In an embodiment, the metal wiring 200 may include a metal such as copper (Cu), molybdenum (Mo), aluminum (Al), titanium (Ti), or the like.

In an embodiment, the metal wiring 200 may be unitary with the first source/drain electrode 190. In such an embodiment, the metal wiring 200 may include substantially the same material as that of the first source/drain electrode 190.

A trench TCH that is recessed downward from an upper surface of the inter-insulating layer 180 may be defined in the inter-insulating layer 180 in the second non-display area NDA2. The metal wiring 200 may extend from the first non-display area NDA1 into the trench TCH in the second non-display area NDA2. In other words, the metal wiring 200 may be disposed in the trench TCH in the second non-display area NDA2.

In an embodiment, a depth of the trench TCH may be less than a thickness of the inter-insulating layer 180 along a thickness direction (e.g., vertical direction in FIG. 3). In such an embodiment, the metal wiring 200 disposed in the trench TCH may be spaced apart from the second gate insulating layer 160 disposed under the inter-insulating layer 180.

In an embodiment, the depth of the trench TCH may be less than a thickness of the metal wiring 200. In such an embodiment, a height of the upper surface of the metal wiring 200 disposed in the trench TCH from the substrate 110 may be greater than a height of the upper surface of the inter-insulating layer 180 from the substrate 110 along a thickness direction (e.g., vertical direction in FIG. 3). In other words, the upper surface of the metal wiring 200 disposed in the trench TCH may protrude upwardly than the upper surface of the inter-insulating layer 180.

The transparent wiring 210 may extend from the first display area DA1 to an upper surface of the metal wiring 200. Accordingly, a lower surface of the transparent wiring 210 may contact the upper surface of the metal wiring 200 disposed in the trench TCH, and the transparent wiring 210 may be electrically connected to the metal wiring 200. The transparent wiring 210 may be disposed in the opening OP on the buffer layer 120 in the first display area DA1, and may be disposed on the inter-insulating layer 180 in the second non-display area NDA2.

In an embodiment, the transparent wiring 210 may include a transparent conductive oxide such as indium tin oxide ("ITO"), indium zinc oxide ("IZO"), indium gallium oxide ("IGO"), tin oxide ($SnO_2$), zinc oxide (ZnO), or the like.

In an embodiment, a thickness of the transparent wiring 210 may be smaller than the thickness of the metal wiring 200. In an embodiment, the thickness of the metal wiring 200 may be about 7000 angstroms (Å), and the thickness of the transparent wiring 210 may be about 500 Å or less, for example.

A transmittance of the transparent wiring 210 may be greater than a transmittance of the first gate electrode 150, a transmittance of the second gate electrode 170, a transmittance of the first source/drain electrode 190, and a transmittance of the metal wiring 200. As the transparent wiring 210 having a relatively high transmittance is disposed in the first display area DA1, the first display area DA1 may have a higher transmittance than those of the second display area DA2, the first non-display area NDA1, and the second non-display area NDA2.

When the trench TCH is not defined in the inter-insulating layer 180 in the second non-display area NDA2, a relatively large step may be provided by the metal wiring 200, and accordingly, the transparent wiring 210 having a relatively small thickness may be disconnected around an end of the metal wiring 200. Specifically, a first portion of the transparent wiring 210 disposed on the inter-insulating layer 180 and a second portion of the transparent wiring 210 disposed on the upper surface of the metal wiring 200 may be disconnected from each other by the step generated by the metal wiring 200.

However, in the embodiments of the invention, the trench TCH may be defined in the inter-insulating layer 180 in the second non-display area NDA2, and the metal wiring 200 may extend into the trench TCH, so that the step due to the metal wiring 200 may be reduced. Accordingly, it is possible to prevent the transparent wiring 210 from being disconnected due to the step generated by the metal wiring 200.

The first via-insulating layer 220 may be disposed on the first source/drain electrode 190, the metal wiring 200, and the transparent wiring 210. The first via-insulating layer 220 may cover the first source/drain electrode 190, the metal wiring 200, and the transparent wiring 210 on the inter-insulating layer 180. In an embodiment, the first via-insulating layer 220 may include an organic insulating material such as photoresist, polyacrylic resin, polyimide resin, polyamide resin, siloxane resin, acrylic resin, epoxy resin, or the like.

The pixel electrode 250 may be disposed on the first via-insulating layer 220. The pixel electrode 250 may be disposed in the first display area DA1 and the second display area DA2. The pixel electrode 250 disposed in the first display area DA1 may be connected to the transparent wiring 210 through a via-hole defined in the first via-insulating layer 220, and the pixel electrode 250 disposed in the second display area DA2 may be connected to the first source/drain electrode 190 through a via-hole defined in the first via-insulating layer 220. The pixel electrode 250 may include a metal, a transparent conductive oxide, or the like. In an embodiment, the pixel electrode 250 may include silver (Ag), indium tin oxide ("ITO"), or the like, for example.

The pixel defining layer 260 may be disposed on the pixel electrode 250. The pixel defining layer 260 may partially cover the pixel electrode 250 on the first via-insulating layer 220. In an embodiment, an opening exposing a central portion of the pixel electrode 250 may be defined in the pixel defining layer 260, and the pixel defining layer 260 may cover a peripheral portion of the pixel electrode 250. In an embodiment, the pixel defining layer 260 may include an organic insulating material such as a photoresist, a polyacrylic resin, a polyimide resin, a polyamide resin, a siloxane resin, an acrylic resin, an epoxy resin, or the like.

The emission layer 270 may be disposed on the pixel electrode 250 in the opening of the pixel defining layer 260. The emission layer 270 may include at least one of an organic light emitting material and a quantum dot.

In an embodiment, the organic light emitting material may include a low molecular weight organic compound or a high molecular weight organic compound. In an embodiment, the low molecular weight organic compound may include at least one of copper phthalocyanine, diphenylbenzidine (N,N'-diphenylbenzidine), tris-(8-hydroxyquinoline)aluminum), and the like. In an embodiment, the high molecular organic compound may include at least one of polyethylenedioxythiophene (poly(3,4-ethylenedioxythiophene), polyaniline), polyphenylenevinylene, polyfluorene, and the like, for example.

In an embodiment, the quantum dot may include one of a core including a group II-VI compound, a group III-V compound, a group IV-VI compound, a group IV element, a group IV compound, and combinations thereof. In an embodiment, the quantum dot may have a core-shell structure including a core and a shell surrounding the core. The shell may serve as a protective layer for maintaining semiconductor properties by preventing chemical modification of the core, and as a charging layer for imparting electrophoretic properties to quantum dots.

The opposite electrode 280 may be disposed on the pixel defining layer 260 and the emission layer 270. The opposite electrode 280 may include a metal, a transparent conductive oxide, or the like. In an embodiment, the opposite electrode 280 may include aluminum (Al), platinum (Pt), silver (Ag), magnesium (Mg), gold (Au), chromium (Cr), tungsten (W), titanium (Ti), etc., for example.

The pixel electrode 250, the emission layer 270, and the opposite electrode 280 may form light emitting elements. In an embodiment, the pixel electrode 250, the emission layer 270, and the opposite electrode 280 may form the first light emitting element EL1 in the first display area DA1, and may form the second light emitting element EL2 in the second display area DA2.

Figure 4:
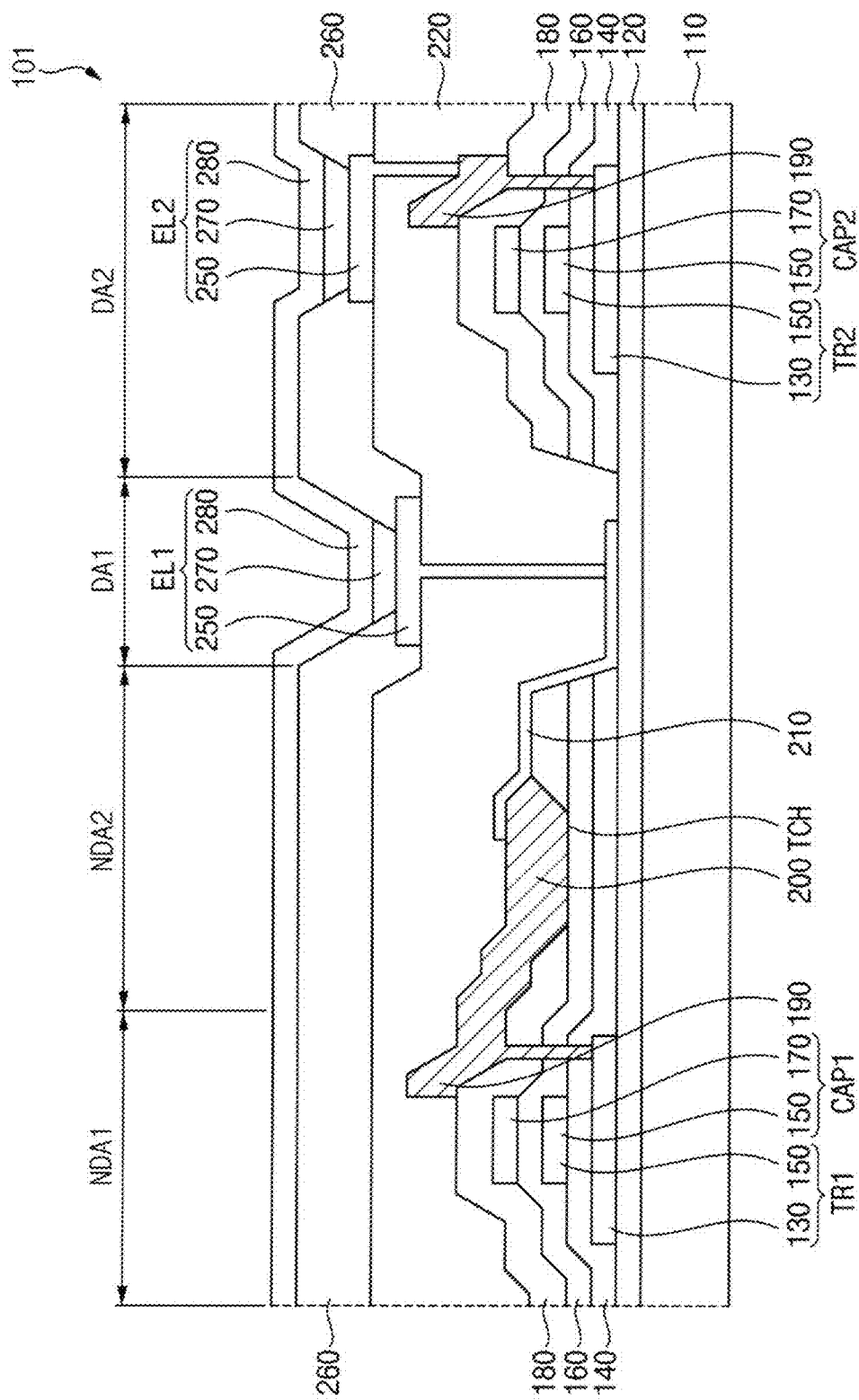
FIG. 4 is a cross-sectional view illustrating an embodiment of a display device.

FIG. 4 is a cross-sectional view illustrating an embodiment of a display device.

The display device 101 described with reference to FIG. 4 may be substantially the same as or similar to the display device 100 described with reference to FIG. 3 except for the depth of the trench TCH. Accordingly, descriptions on the repeated elements will be omitted.

Referring to FIG. 4, in an embodiment, the depth of the trench TCH may be substantially equal to the thickness of the inter-insulating layer 180. In such an embodiment, the metal wiring 200 disposed in the trench TCH may contact an upper surface of the second gate insulating layer 160 disposed under the inter-insulating layer 180.

In the illustrated embodiment, since the depth of the trench TCH is substantially equal to the thickness of the inter-insulating layer 180, the step due to the metal wiring 200 may be further reduced. Accordingly, it is possible to prevent the transparent wiring 210 from being disconnected due to the step generated by the metal wiring 200.

Figure 5:
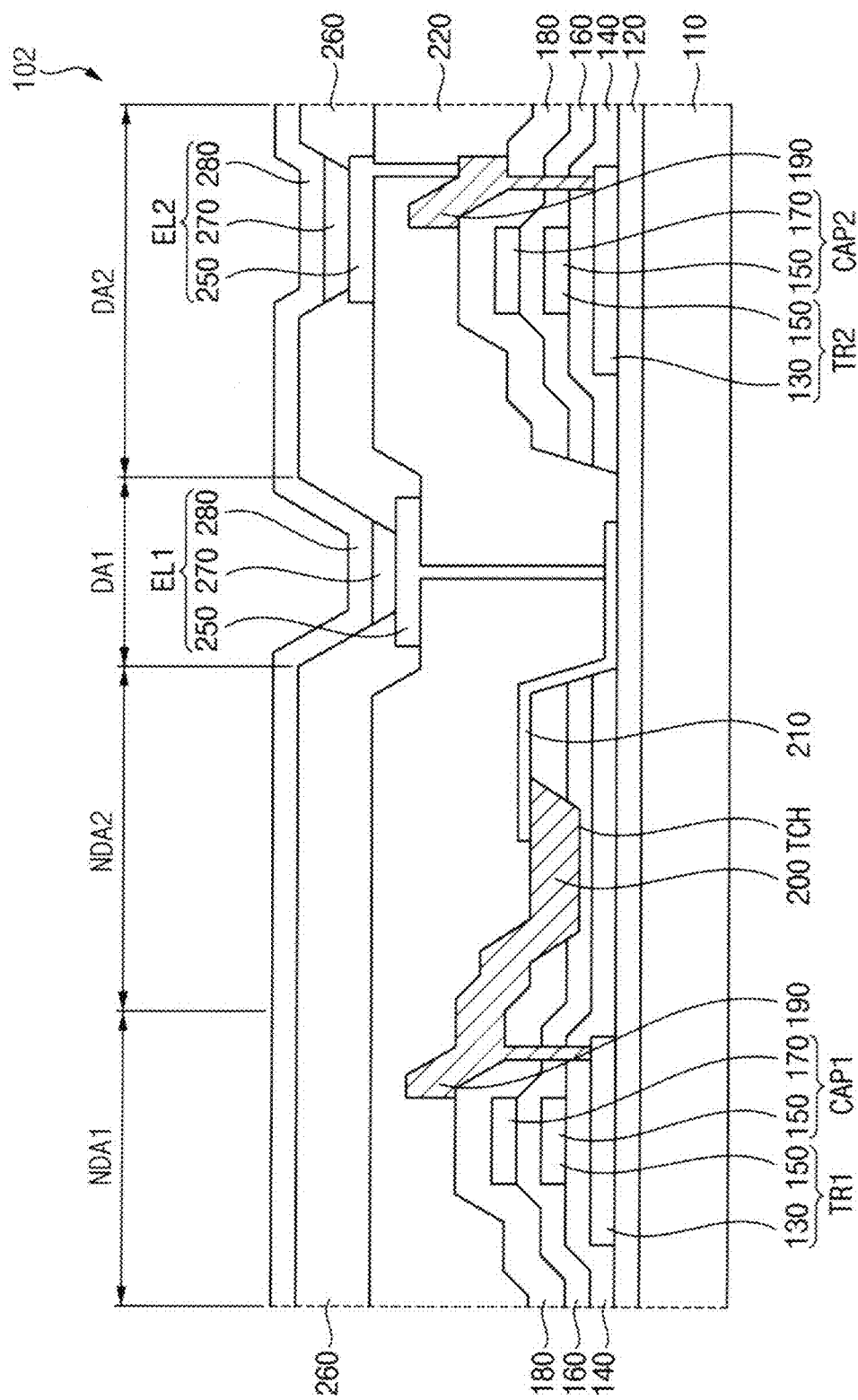
FIG. 5 is a cross-sectional view illustrating an embodiment of a display device.

FIG. 5 is a cross-sectional view illustrating an embodiment of a display device.

The display device 102 described with reference to FIG. 5 may be substantially the same as or similar to the display device 100 described with reference to FIG. 3 except for the depth of the trench TCH. Accordingly, descriptions on the repeated elements will be omitted.

Referring to FIG. 5, in an embodiment, the depth of the trench TCH may be greater than the thickness of the inter-insulating layer 180. In such an embodiment, the trench TCH may be recessed from the upper surface of the inter-insulating layer 180 to at least a portion of the second gate insulating layer 160 disposed under the inter-insulating layer 180.

In an embodiment, the depth of the trench TCH may be substantially equal to the thickness of the metal wiring 200. In such an embodiment, the height of the upper surface of the metal wiring 200 disposed in the trench TCH from the substrate 110 may be substantially equal to the height of the upper surface of the inter-insulating layer 180 from the substrate 110. In other words, the upper surface of the metal wiring 200 disposed in the trench TCH may not protrude upwardly than the upper surface of the inter-insulating layer 180.

In the illustrated embodiment, since the depth of the trench TCH is substantially equal to the thickness of the metal wiring 200, a step due to the metal wiring 200 may not be substantially generated. Accordingly, it is possible to prevent the transparent wiring 210 from being disconnected due to the step generated by the metal wiring 200.

Figure 6:
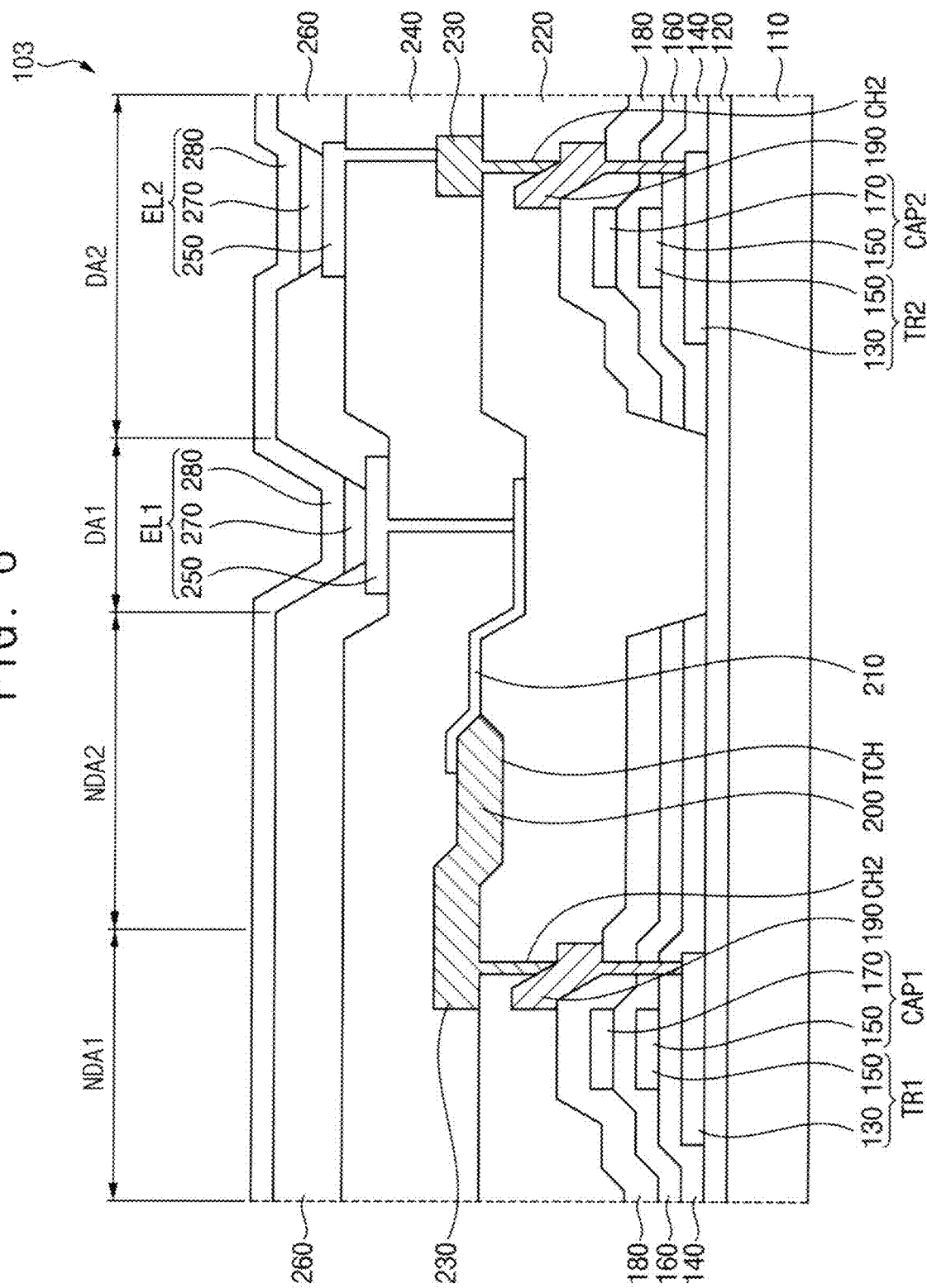
FIG. 6 is a cross-sectional view illustrating an embodiment of a display device.

FIG. 6 is a cross-sectional view illustrating an embodiment of a display device.

Referring to FIG. 6, the display device 103 may include a substrate 110, a buffer layer 120, an active pattern 130, a first gate insulating layer 140, a first gate electrode 150, a second gate insulating layer 160, a second gate electrode 170, an inter-insulating layer 180, a first source/drain electrode 190, a first via-insulating layer 220, a second source/drain electrode 230, a metal wiring 200, a transparent wiring 210, a second via-insulating layer 240, a pixel electrode 250, a pixel defining layer 260, an emission layer 270, and an opposite electrode 280. The display device 103 described with reference to FIG. 6 may be substantially the same as or similar to the display device 100 described with reference to FIG. 3 except for further including the second source/drain electrode 230 and the second via-insulating layer 240, and positions of the metal wiring 200 and the transparent wiring 210. Accordingly, descriptions on the repeated elements will be omitted.

The second source/drain electrode 230 may be disposed on the first via-insulating layer 220. The second source/drain electrode 230 may be disposed in the first non-display area NDA1 and the second display area DA2. The second source/drain electrode 230 may be connected to the first source/drain electrode 190 through a second contact hole CH2 defined in the first via-insulating layer 220. In an embodiment, the second source/drain electrode 230 may include a metal such as copper (Cu), molybdenum (Mo), aluminum (Al), titanium (Ti), or the like.

The metal wiring 200 may be disposed on the first via-insulating layer 220. The metal wiring 200 may be connected to the second source/drain electrode 230 disposed in the first non-display area NDA1.

In an embodiment, the metal wiring 200 may be unitary with the second source/drain electrode 230. In such an embodiment, the metal wiring 200 may include substantially the same material as that of the second source/drain electrode 230.

A trench TCH that is recessed downward from an upper surface of the first via-insulating layer 220 may be defined in the first via-insulating layer 220 in the second non-display area NDA2. The metal wiring 200 may extend from the first non-display area NDA1 into the trench TCH of the second non-display area NDA2.

In an embodiment, a depth of the trench TCH may be less than a thickness of the first via-insulating layer 220. In such an embodiment, the metal wiring 200 disposed in the trench TCH may be spaced apart from the inter-insulating layer 180 disposed under the first via-insulating layer 220.

In an embodiment, the depth of the trench TCH may be less than the thickness of the metal wiring 200. In such an embodiment, a height of an upper surface of the metal wiring 200 disposed in the trench TCH from the substrate 110 may be greater than a height of the upper surface of the first via-insulating layer 220 from the substrate 110. In other words, the upper surface of the metal wiring 200 disposed in the trench TCH may protrude upwardly than the upper surface of the first via-insulating layer 220.

The transparent wiring 210 may extend from the first display area DA1 to the upper surface of the metal wiring 200. The transparent wiring 210 may be disposed on the first via-insulating layer 220 in the first display area DA1 and the second non-display area NDA2.

In the embodiments of the invention, the trench TCH may be defined in the first via-insulating layer 220 in the second non-display area NDA2, and the metal wiring 200 may extend into the trench TCH, so that a step due to the metal wiring 200 may be reduced. Accordingly, it is possible to prevent the transparent wiring 210 from being disconnected due to the step generated by the metal wiring 200.

The second via-insulating layer 240 may be disposed on the second source/drain electrode 230, the metal wiring 200, and the transparent wiring 210. The second via-insulating layer 240 may cover the second source/drain electrode 230, the metal wiring 200, and the transparent wiring 210 on the first via-insulating layer 220. In an embodiment, the second via-insulating layer 240 may include an organic insulating material such as photoresist, polyacrylic resin, polyimide resin, polyamide resin, siloxane resin, acrylic resin, epoxy resin, or the like.

The pixel electrode 250 may be disposed on the second via-insulating layer 240. The pixel electrode 250 disposed in the first display area DA1 may be connected to the transparent wiring 210 through a via-hole defined in the second via-insulating layer 240, and the pixel electrode 250 disposed in the second display area DA2 may be connected to the second source/drain electrode 230 through a via-hole defined in the second via-insulating layer 240.

Figure 7:
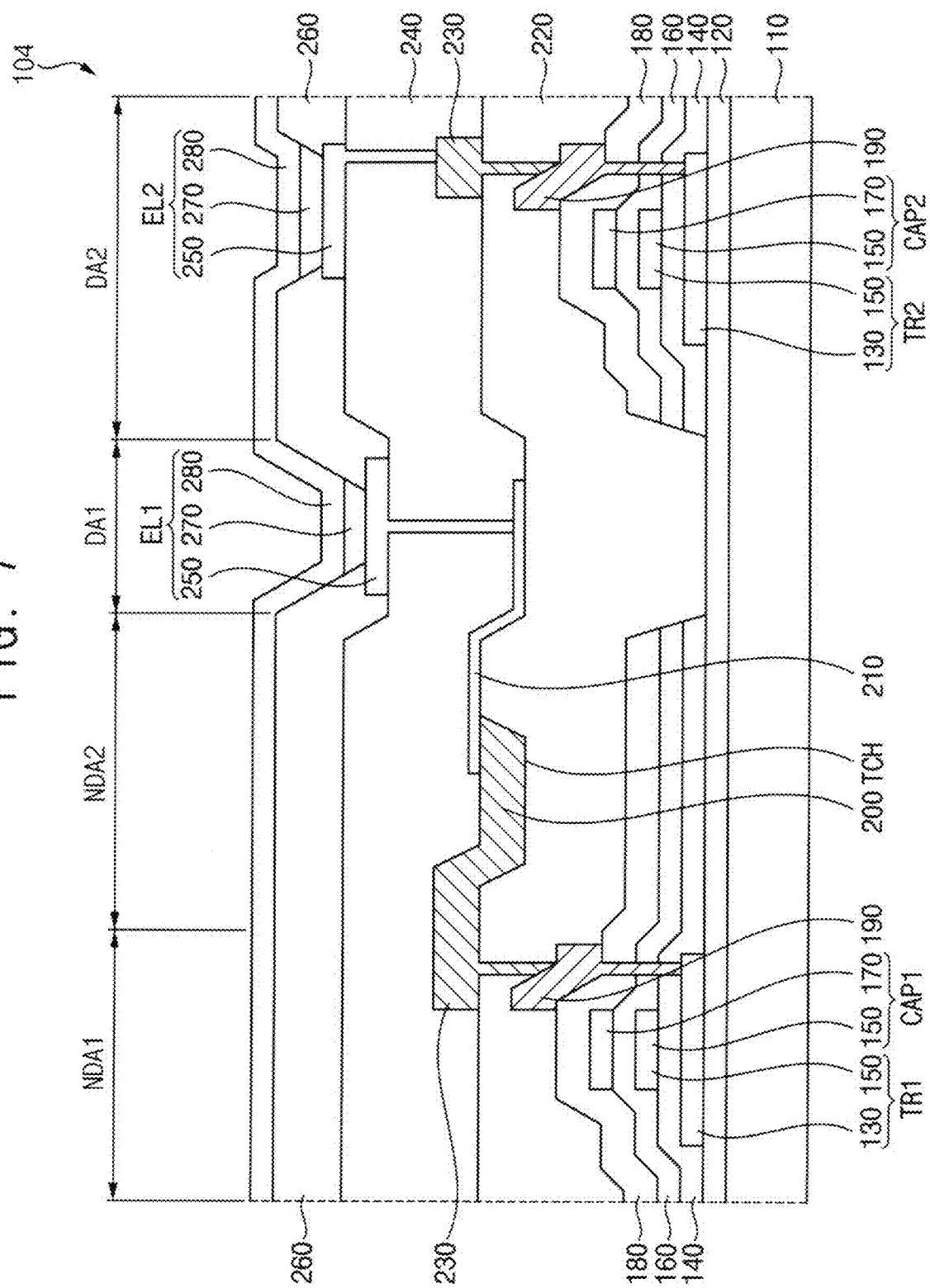
FIG. 7 is a cross-sectional view illustrating an embodiment of a display device.

FIG. 7 is a cross-sectional view illustrating an embodiment of a display device.

The display device 104 described with reference to FIG. 7 may be substantially the same as or similar to the display device 103 described with reference to FIG. 6 except for the depth of the trench TCH. Accordingly, descriptions on repeated elements will be omitted.

Referring to FIG. 7, in an embodiment, the depth of the trench TCH may be substantially equal to the thickness of the metal wiring 200. In such an embodiment, a height of the upper surface of the metal wiring 200 disposed in the trench TCH from the substrate 110 may be substantially equal to a height of the upper surface of the first via-insulating layer 220 from the substrate 110. In other words, the upper surface of the metal wiring 200 disposed in the trench TCH may not protrude upwardly than the upper surface of the first via-insulating layer 220.

In the illustrated embodiment, since the depth of the trench TCH is substantially equal to the thickness of the metal wiring 200, a step due to the metal wiring 200 may not be substantially generated. Accordingly, it is possible to prevent the transparent wiring 210 from being disconnected due to the step generated by the metal wiring 200.

FIGS. 8, 9, 10, and 11 are cross-sectional views illustrating an embodiment of a method of manufacturing a display device. In an embodiment, FIGS. 8 to 11 may illustrate a method of manufacturing the display device 100 illustrated in FIG. 3, for example.

Figure 8:
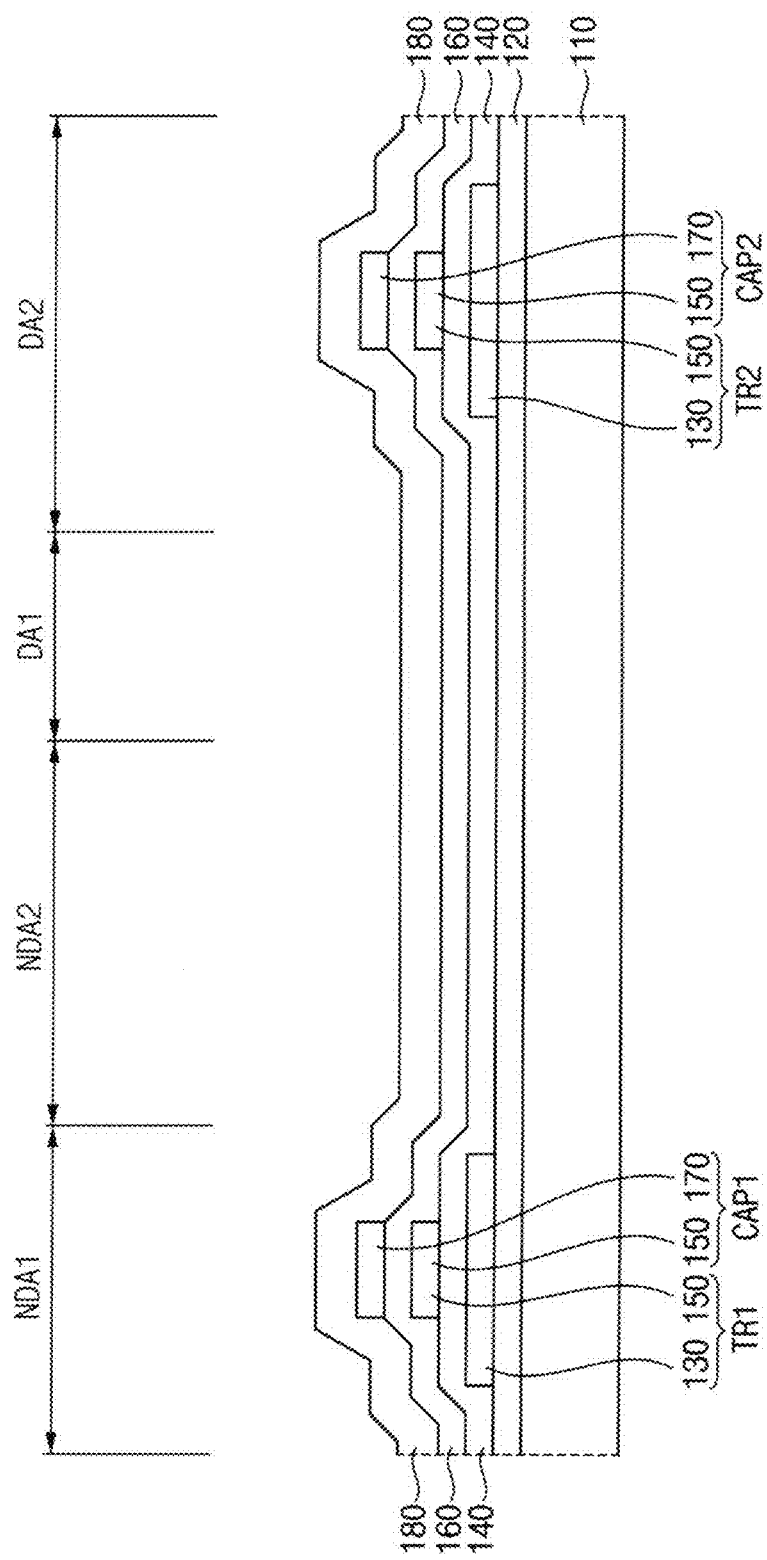
FIGS. 8, 9, 10, and 11 are cross-sectional views illustrating an embodiment of a method of manufacturing a display device.

Referring to FIG. 8, a first pixel circuit and a second pixel circuit may be respectively formed in the first non-display area (also referred to as a first non-pixel area) NDA1 and the second display area (also referred to as a second pixel area) DA2 on the substrate 110. The buffer layer 120, the active pattern 130, the first gate insulating layer 140, the first gate electrode 150, the second gate insulating layer 160, and the second gate electrode 170 may be sequentially formed on the substrate 110.

The active pattern 130 and the first gate electrode 150 may form the first transistor TR1 in the first non-display area NDA1, and may form the second transistor TR2 in the second display area DA2. The first gate electrode 150 and the second gate electrode 170 may form the first capacitor CAP1 in the first non-display area NDA1, and may form the second capacitor CAP2 in the second display area DA2. The first transistor TR1 and the first capacitor CAP1 disposed in the first non-display area NDA1 may form the first pixel circuit, and the second transistor TR2 and the second capacitor CAP2 disposed in the second display area DA2 may form the second pixel circuit.

The inter-insulating layer 180 may be formed on the substrate 110 on which the first pixel circuit and the second pixel circuit are formed. In an embodiment, the inter-insulating layer 180 may include an inorganic insulating material such as silicon nitride, silicon oxide, silicon oxynitride, etc., using a vapor deposition method such as a chemical vapor deposition, a physical vapor deposition, etc.

Figure 9:
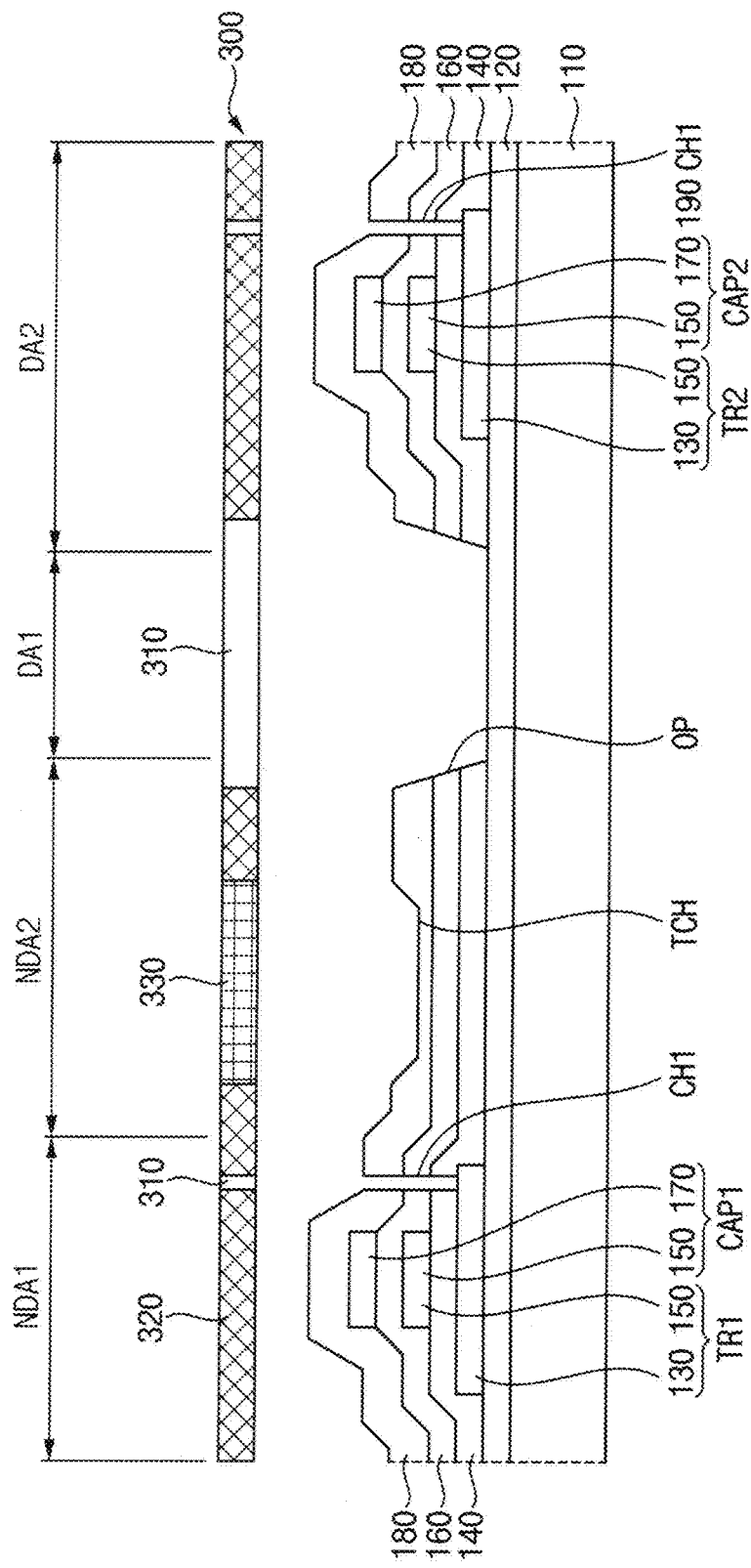

Referring to FIG. 9, the first contact hole CH1 passing through the first gate insulating layer 140, the second gate insulating layer 160, and the inter-insulating layer 180 may be defined in each of the first non-display area NDA1 and the second display area DA2, the opening OP passing through the first gate insulating layer 140, the second gate insulating layer 160, and the inter-insulating layer 180 may be defined in the first display area DA1, and the trench TCH recessed downward from the upper surface of the inter-insulating layer 180 may be defined in the second non-display area NDA2. The depth of the trench TCH may be less than a depth of the first contact hole CH1 and a depth of the opening OP.

The first contact hole CH1, the opening OP, and the trench TCH may be substantially simultaneously defined by a photo mask 300. In an embodiment, the photo mask 300 may be a halftone mask or a slit mask.

When the photo mask 300 is the halftone mask, the halftone mask 300 may include a light transmitting portion 310, a light blocking portion 320, and a semi-transmitting portion 330. The light transmitting portion 310 may transmit substantially all of the external light, and the light blocking portion 320 may block substantially all of the external light. A transmittance of the semi-transmitting portion 330 may be less than a transmittance of the light transmitting portion 310, and may be greater than a transmittance of the light blocking portion 320. The light transmitting portion 310 may overlap the first contact hole CH1 and the opening OP, and the semi-transmitting portion 330 may overlap the trench TCH.

As the first contact hole CH1, the opening OP, and the trench TCH are defined using the halftone mask or the slit mask, the depth of the trench TCH may be less than the depth of the first contact hole CH1 and the depth of the opening OP. Further, since the trench TCH is defined together with the first contact hole CH1 and the opening OP, an additional process for forming the trench TCH may not be desired.

Figure 10:
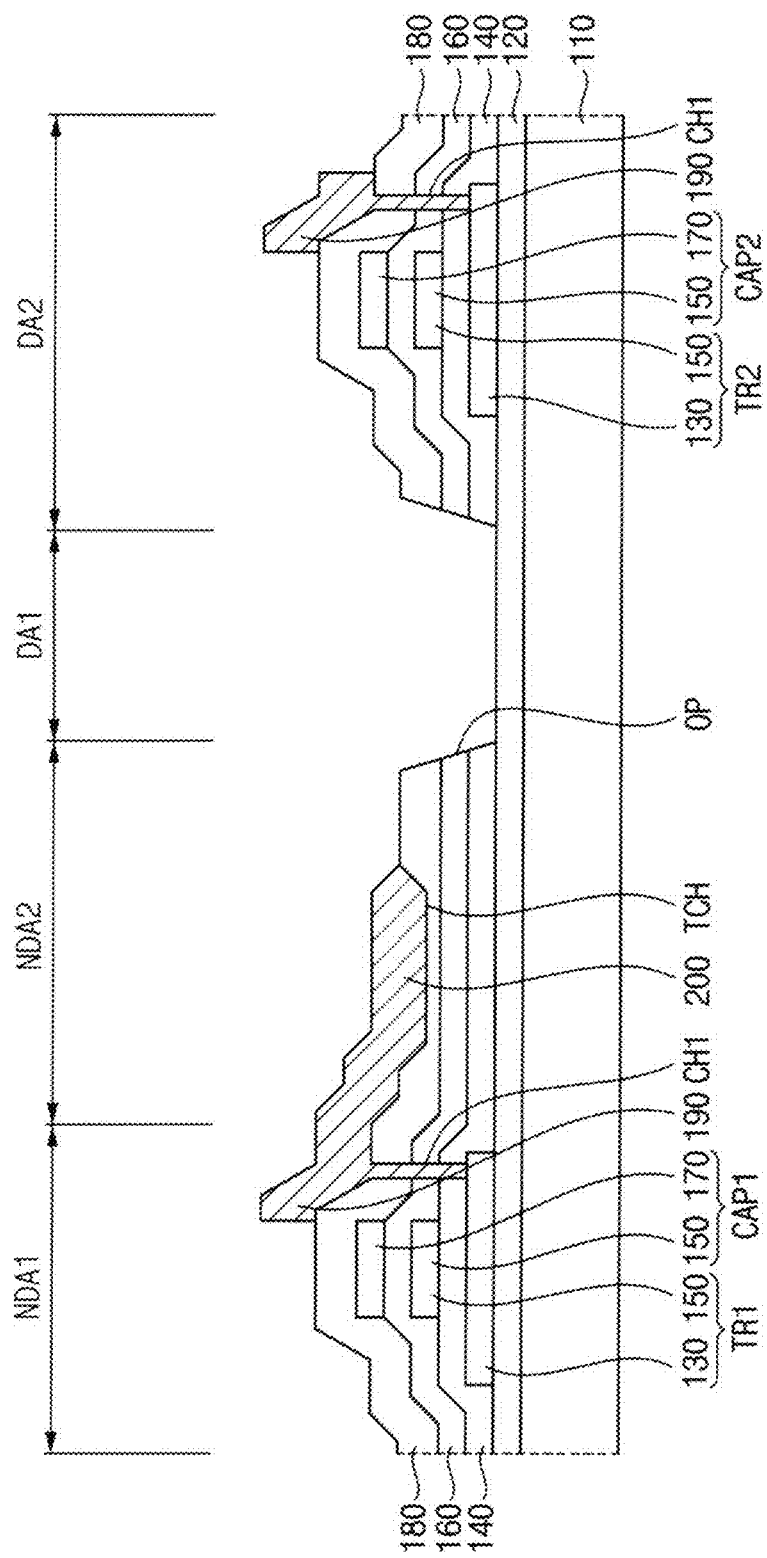

Referring to FIG. 10, the first source/drain electrode 190 and the metal wiring 200 may be disposed on the inter-insulating layer 180. The first source/drain electrode 190 may fill the first contact hole CH1, and may contact the active pattern 130. The metal wiring 200 may be connected to the first pixel circuit, and may extend from the first non-display area NDA1 into the trench TCH in the second non-display area NDA2. In an embodiment, the metal wiring 200 may be unitary with the first source/drain electrode 190.

Figure 11:
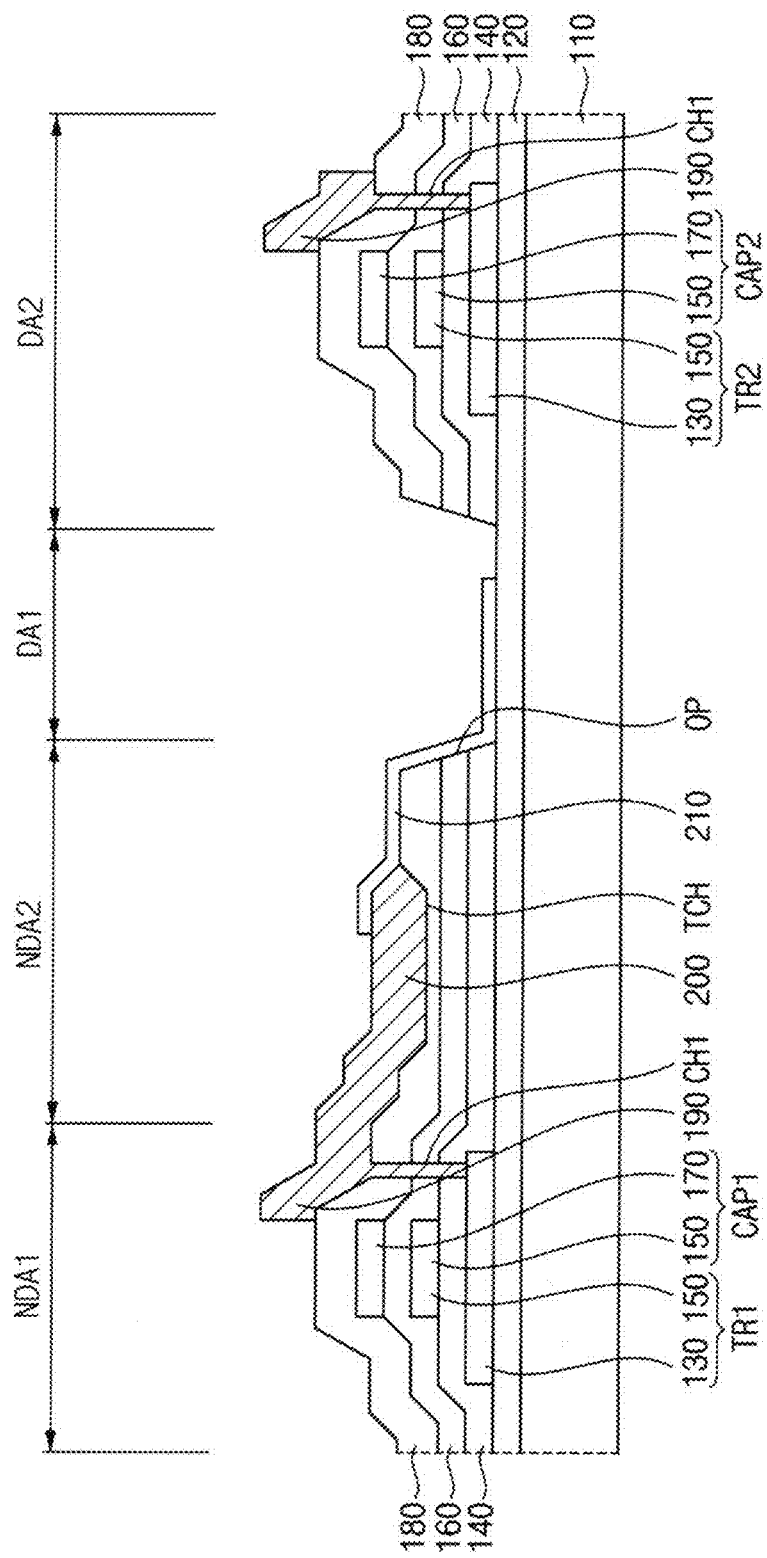

Referring to FIG. 11, the transparent wiring 210 may be disposed on the inter-insulating layer 180. The transparent wiring 210 may extend from the first display area DA1 to the upper surface of the metal wiring 200. The trench TCH may be defined in the inter-insulating layer 180 in the second non-display area NDA2, and the metal wiring 200 may extend into the trench TCH, so that the step due to the metal wiring 200 may be reduced. Accordingly, although the transparent wiring 210 extends from the upper surface of the inter-insulating layer 180 to the upper surface of the metal wiring 200, the transparent wiring 210 may not be disconnected due to the step generated by the metal wiring 200.

Referring to FIG. 3, the first via-insulating layer 220 may be disposed on the first source/drain electrode 190, the metal wiring 200, and the transparent wiring 210, and the first light emitting element EL1 and the second light emitting element EL2 may be disposed on the first via-insulating layer 220 in the first display area DA1 and the second display area DA2, respectively. The pixel electrode 250, the pixel defining layer 260, the emission layer 270, and the opposite electrode 280 may be sequentially disposed on the first via-insulating layer 220. The pixel electrode 250, the emission layer 270, and the opposite electrode 280 may form the first light emitting element EL1 in the first display area DA1, and may form the second light emitting element EL2 in the second display area DA2.

FIGS. 12, 13, 14, and 15 are cross-sectional views illustrating an embodiment of a method of manufacturing a display device. In an embodiment, FIGS. 12 to 15 may illustrate a method of manufacturing the display device 103 illustrated in FIG. 6, for example. Descriptions on elements of the method of manufacturing the display device 103 described with reference to FIGS. 6 and 12 to 15, which are substantially the same as or similar to those of the method of manufacturing the display device 100 described with reference to FIGS. 3 and 8 to 11, will be omitted.

Figure 12:
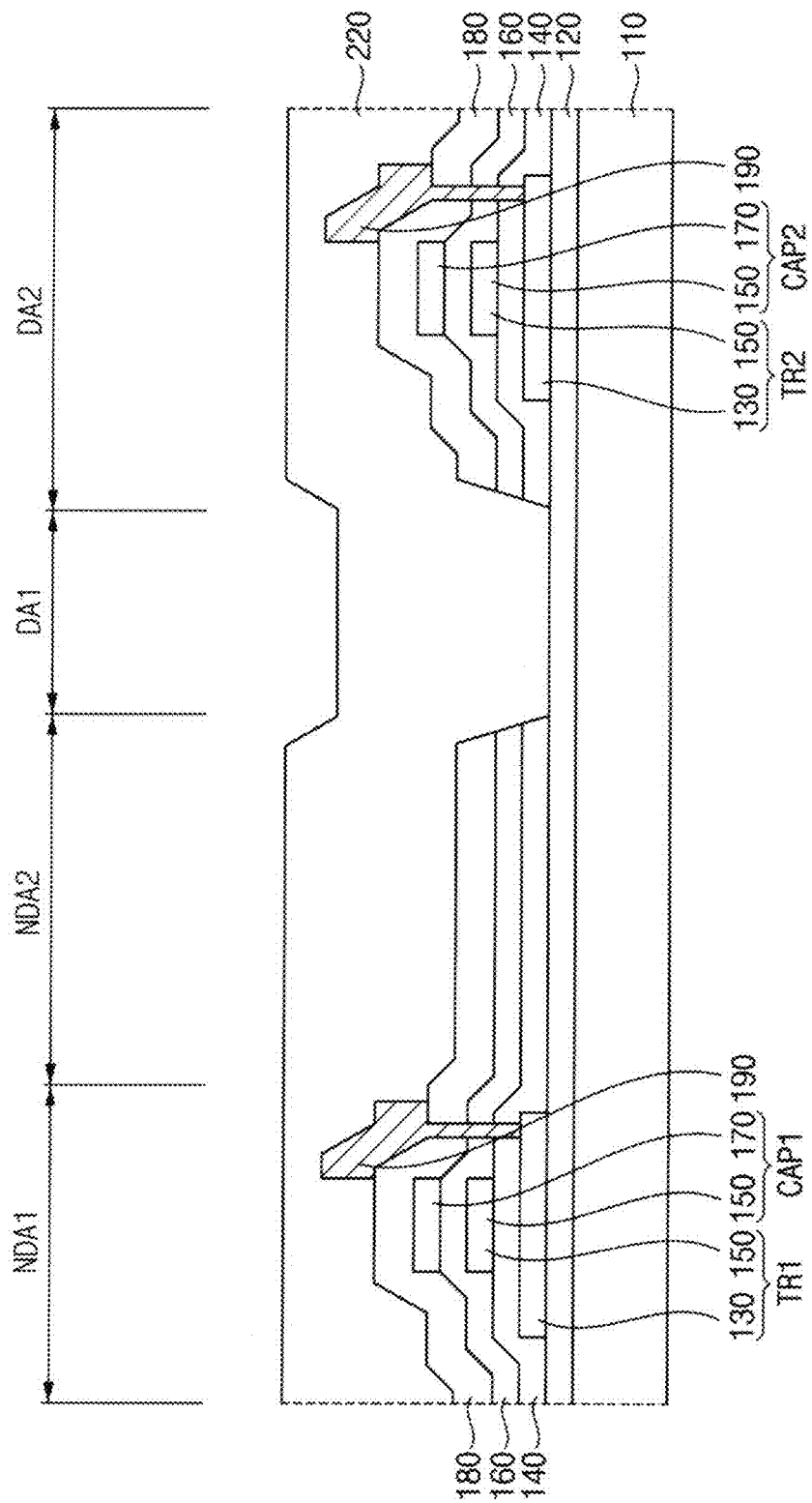
FIGS. 12, 13, 14, and 15 are cross-sectional views illustrating an embodiment of a method of manufacturing a display device.

Referring to FIG. 12, the first pixel circuit and the second pixel circuit may be respectively disposed in the first non-display area NDA1 and the second display area DA2 on the substrate 110. The buffer layer 120, the active pattern 130, the first gate insulating layer 140, the first gate electrode 150, the second gate insulating layer 160, and the second gate electrode 170, the inter-insulating layer 180, and the first source/drain electrodes 190 may be sequentially disposed on the substrate 110.

The first via-insulating layer 220 may be disposed on the substrate 110 on which the first pixel circuit and the second pixel circuit are disposed. In an embodiment, the first via-insulating layer 220 may include an organic insulating material such as photoresist, polyacrylic resin, polyimide resin, polyamide resin, siloxane resin, acrylic resin, epoxy resin, etc., using a coating method.

Figure 13:
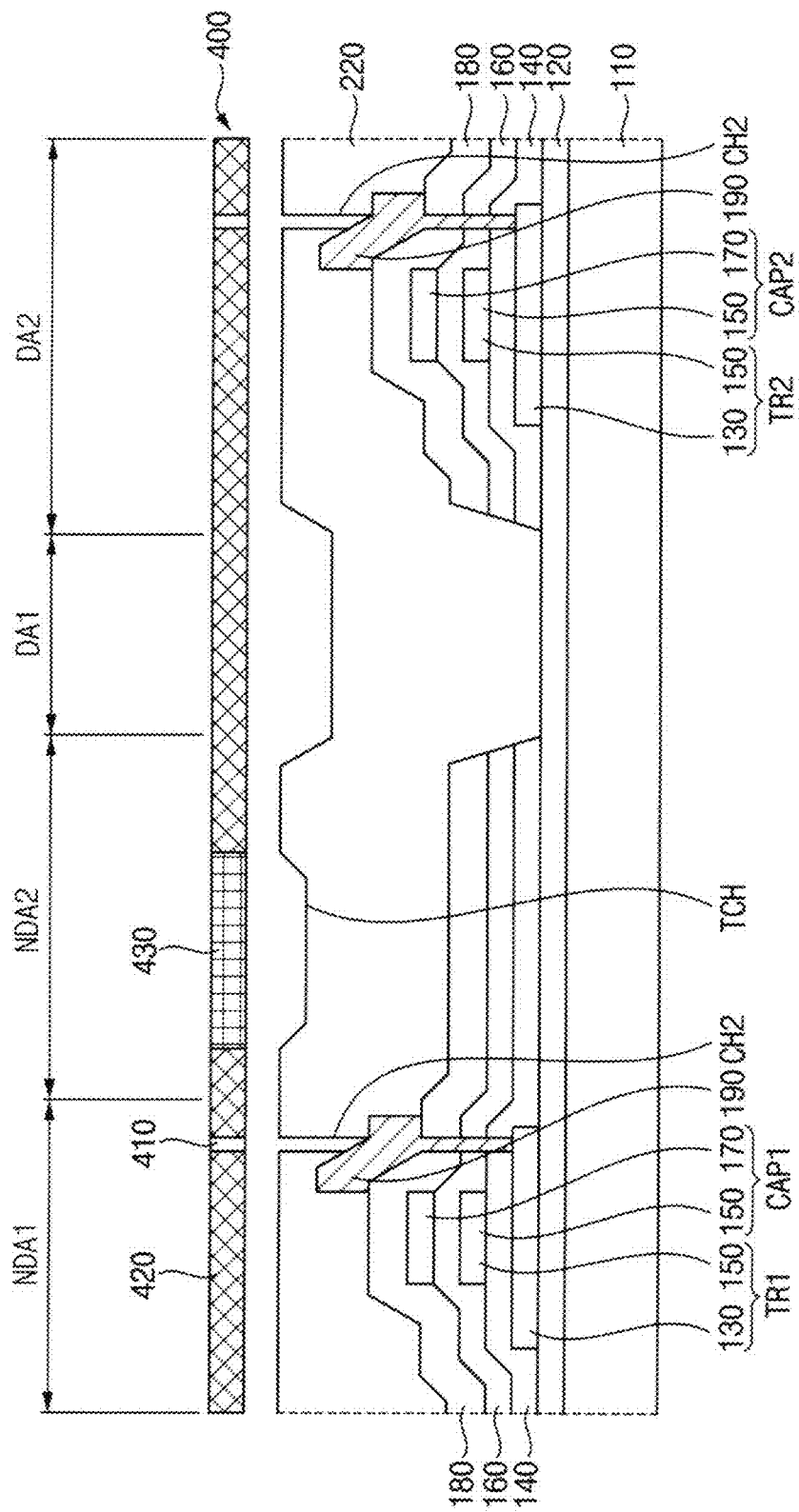

Referring to FIG. 13, the second contact hole CH2 passing through the first via-insulating layer 220 may be defined in each of the first non-display area NDA1 and the display area DA2, and the trench TCH recessed downward from the upper surface of the first via-insulating layer 220 may be defined in the second non-display area NDA2. The depth of the trench TCH may be less than a depth of the second contact hole CH2.

The second contact hole CH2 and the trench TCH may be substantially simultaneously defined using a photo mask 400. In an embodiment, the photo mask 400 may be a halftone mask or a slit mask.

When the photo mask 400 is the halftone mask, the halftone mask 400 may include a light transmitting portion 410, a light blocking portion 420, and a semi-transmitting portion 430. The light transmitting portion 410 may transmit substantially all of the external light, and the light blocking portion 420 may block substantially all of the external light. A transmittance of the semi-transmitting portion 430 may be less than a transmittance of the light transmitting portion 410, and may be greater than a transmittance of the light blocking portion 420. The light transmitting portion 410 may overlap the second contact hole CH2, and the semi-transmitting portion 430 may overlap the trench TCH.

As the second contact hole CH2 and the trench TCH are defined using the halftone mask or the slit mask, the depth of the trench TCH may be less than the depth of the second contact hole CH2. Further, since the trench TCH is defined together with the second contact hole CH2, an additional process for forming the trench TCH may not be desired.

Figure 14:
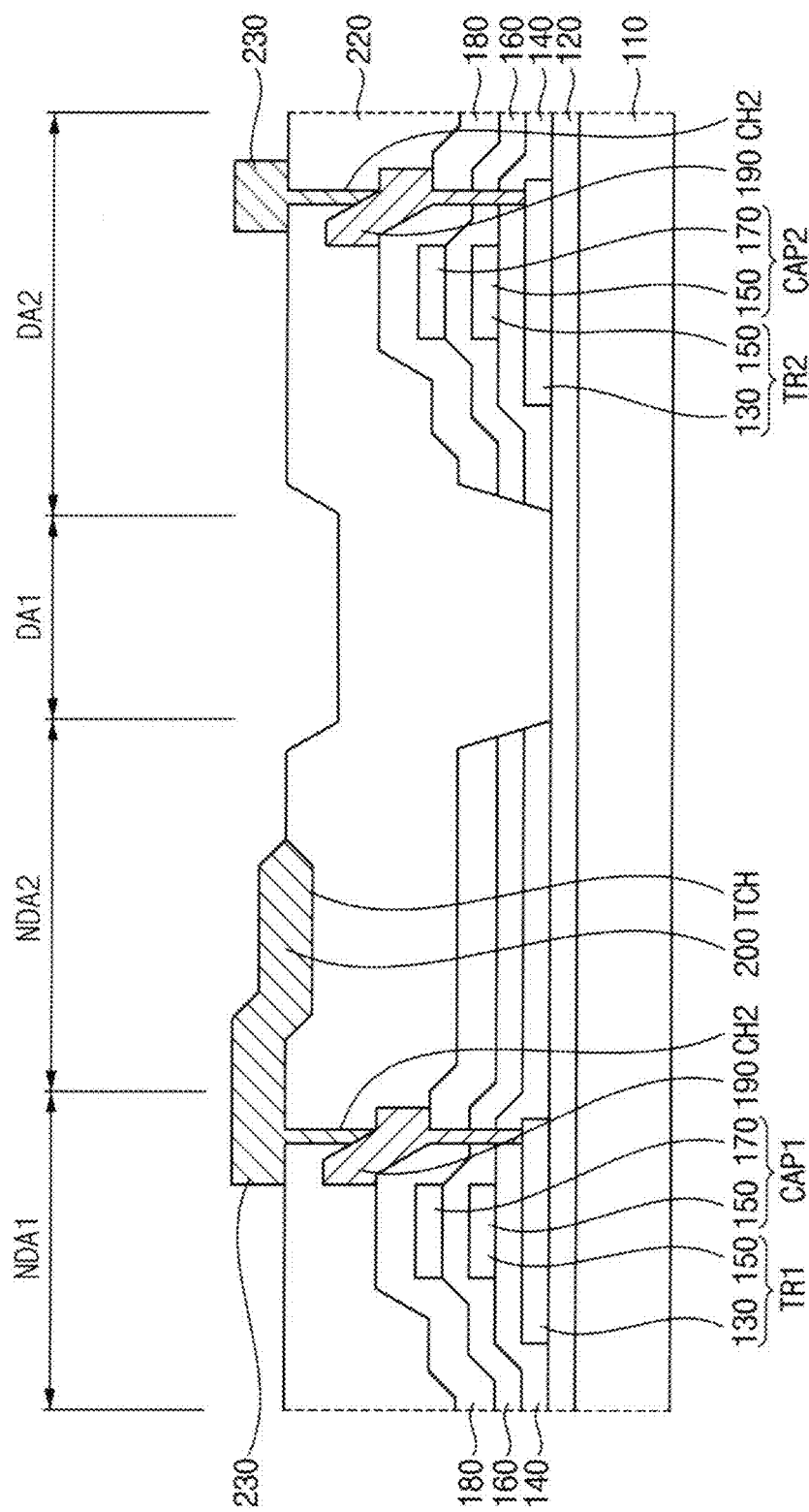

Referring to FIG. 14, the second source/drain electrode 230 and the metal wiring 200 may be disposed on the first via-insulating layer 220. The second source/drain electrode 230 may fill the second contact hole CH2, and may contact the first source/drain electrode 190. The metal wiring 200 may be connected to the first pixel circuit, and may extend from the first non-display area NDA1 into the trench TCH in the second non-display area NDA2. In an embodiment, the metal wiring 200 may be unitary with the second source/drain electrode 230.

Figure 15:
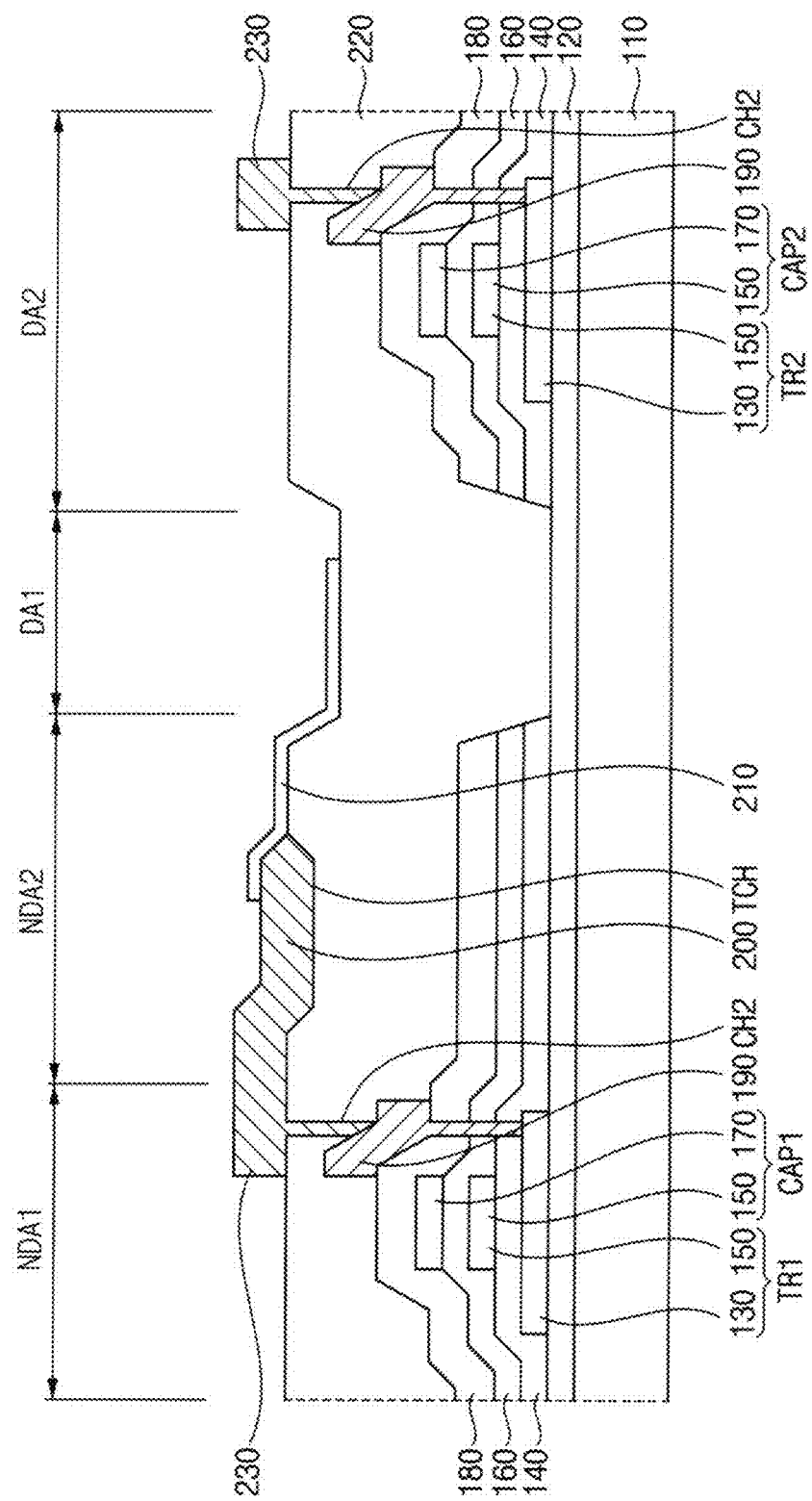

Referring to FIG. 15, the transparent wiring 210 may be disposed on the first via-insulating layer 220. The transparent wiring 210 may extend from the first display area DA1 to the upper surface of the metal wiring 200. The trench TCH may be defined in the first via-insulating layer 220 in the second non-display area NDA2, and the metal wiring 200 may extend into the trench TCH, so that the step due to the metal wiring 200 may be reduced. Accordingly, although the transparent wiring 210 extends from the upper surface of the first via-insulating layer 220 to the upper surface of the metal wiring 200, the transparent wiring 210 may not be disconnected due to the step generated by the metal wiring 200.

Referring to FIG. 6, the second via-insulating layer 240 may be disposed on the second source/drain electrode 230, the metal wiring 200, and the transparent wiring 210, and the first light emitting element EL1 and the second light emitting element EL2 may be disposed on the second via-insulating layer 240 in the first display area (also referred to as a first pixel area) DA1 and the second display area DA2, respectively. The pixel electrode 250, the pixel defining layer 260, the emission layer 270, and the opposite electrode 280 may be sequentially disposed on the second via-insulating layer 240.

The display device in the embodiments may be applied to a display device included in a computer, a notebook, a mobile phone, a smartphone, a smart pad, a portable media player ("PMP"), a personal digital assistant ("PDA"), an MP3 player, or the like.

Although the display devices and the methods of manufacturing the display devices in the embodiments have been described with reference to the drawings, the illustrated embodiments are examples, and may be modified and changed by a person having ordinary knowledge in the relevant technical field without departing from the technical spirit.

What is claimed is:

1. A display device, comprising:
    a substrate including a first display area, a first non-display area spaced apart from the first display area, and a second non-display area disposed between the first display area and the first non-display area;
    a first light emitting element disposed on the substrate in the first display area;
    a first pixel circuit disposed on the substrate in the first non-display area and electrically connected to the first light emitting element;
    a first insulating layer disposed on the substrate, covering the first pixel circuit, and including a first surface facing the substrate;
    a metal wiring disposed on the first insulating layer, connected to the first pixel circuit, extending from the first non-display area to the second non-display area, and including a first surface facing the first insulating layer; and
    a transparent wiring disposed on the first insulating layer, connecting the first light emitting element and the metal wiring, and extending from the first display area to a second surface of the metal wiring opposite to the first surface of the metal wiring,
    wherein a trench is defined in a second surface of the first insulating layer opposite to the first surface of the first insulating layer in the second non-display area, and
    wherein the metal wiring is disposed in the trench in the second non-display area.

2. The display device of claim 1, wherein a depth of the trench is less than a thickness of the first insulating layer along a direction perpendicular to a main plane extension direction of the substrate.

3. The display device of claim 1, wherein a depth of the trench is equal to a thickness of the first insulating layer along a direction perpendicular to a main plane extension direction of the substrate.

4. The display device of claim 1, wherein a depth of the trench is greater than a thickness of the first insulating layer along a direction perpendicular to a main plane extension direction of the substrate.

5. The display device of claim 1, wherein a depth of the trench is less than a thickness of the metal wiring along a direction perpendicular to a main plane extension direction of the substrate.

6. The display device of claim 1, wherein a depth of the trench is equal to a thickness of the metal wiring along a direction perpendicular to a main plane extension direction of the substrate.

7. The display device of claim 1, wherein a thickness of the transparent wiring is less than a thickness of the metal wiring along a direction perpendicular to a main plane extension direction of the substrate.

8. The display device of claim 1, wherein the first insulating layer includes an inorganic insulating material.

9. The display device of claim 8, further comprising:
    a second insulating layer disposed between the substrate and the first insulating layer.

10. The display device of claim 9, wherein the trench is recessed from the second surface of the first insulating layer to at least a portion of the second insulating layer.

11. The display device of claim 9, wherein the second insulating layer includes an inorganic insulating material.

12. The display device of claim 1, wherein the first insulating layer includes an organic insulating material.

13. The display device of claim 1, wherein the first light emitting element includes a pixel electrode, an emission layer disposed on the pixel electrode, and an opposite electrode disposed on the emission layer, and
    wherein the transparent wiring is connected to the pixel electrode.

14. The display device of claim 1, wherein the transparent wiring includes at least one of indium tin oxide, indium zinc oxide, indium gallium oxide, tin oxide, and zinc oxide.

15. The display device of claim 1, wherein the substrate further includes a second display area surrounding at least a portion of the first display area, and
    wherein the display device further includes:
    a second light emitting element disposed on the substrate in the second display area; and
    a second pixel circuit overlapping the second light emitting element and electrically connected to the second light emitting element.

16. The display device of claim 15, wherein a transmittance of the first display area is greater than a transmittance of the second display area.

17. A method of manufacturing a display device, the method comprising:
    forming a first pixel circuit on a substrate in a first non-display area spaced apart from a first display area;
    forming a first insulating layer covering the first pixel circuit on the substrate and including a first surface facing the substrate;
    defining a trench in a second surface of the first insulating layer opposite to the first surface of the first insulating layer in a second non-display area disposed between the first display area and the first non-display area;
    forming a metal wiring connected to the first pixel circuit, extending from the first non-display area into the trench in the second non-display area on the first insulating layer, and including a first surface facing the first insulating layer;

forming a transparent wiring extending from the first display area to a second surface of the metal wiring opposite to the first surface of the metal wiring on the first insulating layer; and forming a first light emitting element connected to the transparent wiring on the first insulating layer in the first display area.

18. The method of claim 17, wherein the trench is defined using a halftone mask or a slit mask.

19. The method of claim 17, wherein the first insulating layer includes an inorganic insulating material.

20. The method of claim 17, wherein the first insulating layer includes an organic insulating material.

* * * * *